US012617023B2

(12) United States Patent
Wang et al.

(10) Patent No.: US 12,617,023 B2
(45) Date of Patent: May 5, 2026

(54) SILICON NITRIDE CERAMIC TOOL COMPRISING DIAMOND FILM AND METHOD OF PREPARING THE SAME

(71) Applicant: Guangdong University of Technology, Guangzhou (CN)

(72) Inventors: Chengyong Wang, Guangzhou (CN); Yuhai Zhou, Guangzhou (CN); Lijuan Zheng, Guangzhou (CN)

(73) Assignee: GUANGDONG UNIVERSITY OF TECHNOLOGY, Guangzhou (CN)

( * ) Notice: Subject to any disclaimer, the term of this patent is extended or adjusted under 35 U.S.C. 154(b) by 1144 days.

(21) Appl. No.: 17/214,979

(22) Filed: Mar. 29, 2021

(65) Prior Publication Data

US 2021/0237168 A1 Aug. 5, 2021

Related U.S. Application Data

(63) Continuation-in-part of application No. PCT/CN2018/108380, filed on Sep. 28, 2018.

(51) Int. Cl.
*C23C 16/27* (2006.01)
*B23B 27/14* (2006.01)

(52) U.S. Cl.
CPC .......... *B23B 27/148* (2013.01); *C23C 16/271* (2013.01); *B23B 2226/00* (2013.01); *B23B 2226/31* (2013.01); *B23B 2228/105* (2013.01)

(58) Field of Classification Search
CPC .............. C23C 16/271; C23C 16/0245; C23C 16/0254; C23C 16/0272; C04B 41/009;

C04B 35/584; C04B 41/5002; C04B 41/4531; C04B 41/52; C04B 41/4539; C04B 41/5346; C04B 41/85; C04B 41/89;
(Continued)

(56) References Cited

U.S. PATENT DOCUMENTS 5,082,359 A * 1/1992 Kirkpatrick ......... C23C 16/0263
427/586
5,626,908 A * 5/1997 Iio ......................... C04B 41/009
427/249.7
(Continued)

FOREIGN PATENT DOCUMENTS

CN 85100128 A * 8/1986
CN 105624677 A * 6/2016
(Continued)

OTHER PUBLICATIONS

CN-85100128-A, machine translation, originally published 1986, p. 1-8 (Year: 1986).*
(Continued)

*Primary Examiner* — Gordon Baldwin
*Assistant Examiner* — Christina D McClure
(74) *Attorney, Agent, or Firm* — MATTHIAS SCHOLL P.C.; Matthias Scholl

(57) ABSTRACT

A cutting tool, including a silicon nitride ($Si_3N_4$) ceramic substrate, and a diamond film coated on the surface of the $Si_3N_4$ ceramic substrate. The diamond film has a thickness of 7-12 $\mu$m. The cutting tool includes a tool nose, a blade, and a handle. The blade has a rake angle $\gamma$ of 5-15°, a clearance angle $\alpha$ of 10-14°, and a helix angle of 15-45°. The blade includes four cutting edges.

4 Claims, 7 Drawing Sheets

(58) Field of Classification Search
CPC .............. B23B 27/148; B23B 2226/00; B23B 2226/31; B23B 2228/105; B23C 5/10; B23C 2210/0457; B23C 2210/0485; B23C 2210/082; B23C 2210/203; B23C 2226/18; B23C 2226/315
See application file for complete search history.

(56) References Cited

U.S. PATENT DOCUMENTS

| | | | |
|---|---|---|---|
| 2010/0209665 A1* | 8/2010 | Konovalov | B82Y 40/00 977/734 |
| 2015/0017468 A1* | 1/2015 | Lukitsch | C23C 14/325 204/192.15 |
| 2015/0376804 A1* | 12/2015 | Gorokhovsky | C23C 14/0611 204/290.03 |
| 2017/0252837 A1* | 9/2017 | Ootaka | B23C 5/205 |
| 2019/0134721 A1* | 5/2019 | Waki | C30B 29/04 |

FOREIGN PATENT DOCUMENTS

| | | | | |
|---|---|---|---|---|
| JP | 07196399 A | * | 8/1995 | |
| WO | WO-2009083778 A2 | * | 7/2009 | C23C 16/271 |

OTHER PUBLICATIONS

CN-105624677-A, machine translation, originally published 2018, p. 1-10 (Year: 2018).*
JP-07196399-A, machine translation, originally published 1995, p. 1-9 (Year: 1995).*
Global Safety Management, "Ethanol, Anhydrous", 2015, p. 1-9 (Year: 2015).*

* cited by examiner

SILICON NITRIDE CERAMIC TOOL COMPRISING DIAMOND FILM AND METHOD OF PREPARING THE SAME

CROSS-REFERENCE TO RELATED APPLICATIONS

This application is a continuation-in-part of International Patent Application No. PCT/CN2018/108380 with an international filing date of Sep. 28, 2018, designating the United States, now pending, the contents of which, including any intervening amendments thereto, are incorporated herein by reference. Inquiries from the public to applicants or assignees concerning this document or the related applications should be directed to: Matthias Scholl P. C., Attn.: Dr. Matthias Scholl Esq., 245 First Street, 18th Floor, Cambridge, MA 02142.

BACKGROUND

The disclosure relates to the field of cutting tools, and more particularly to a silicon nitride ($Si_3N_4$) ceramic tool comprising diamond film and a method of preparing the same.

Cemented carbide (WC—Co) and silicon nitride ceramic are two main matrix materials for cutting tools. The existence of Co phase on the surface of cemented carbide is not conducive to the nucleation of the diamond film and will reduce the adhesion between the film and the substrate. The silicon nitride ceramic tools are easy to wear down.

SUMMARY

The disclosure provides a cutting tool, comprising a silicon nitride ($Si_3N_4$) ceramic substrate, and a diamond film coated on a surface of the $Si_3N_4$ ceramic substrate. The diamond film having a thickness of 7-12 µm.

In a class of this embodiment, the cutting tool comprises a tool nose, a blade, and a handle; the blade has a rake angle $\gamma$ of 5-15°, a clearance angle $\alpha$ of 10-14°, and a helix angle of 15-45°; and the blade comprises four cutting edges.

In a class of this embodiment, the radius R of the tool nose is 0.18-0.22 mm.

In a class of this embodiment, the blade has a length H1 of 4.7-5.3 mm.

In a class of this embodiment, the cutting tool has a length H2 of 49.5-50.5 mm.

The disclosure also provides a method of preparing the cutting tool, the method comprising:

1) putting silicon nitride ($Si_3N_4$) ceramic substrate in a hexane suspension mixed with diamond powders, and ultrasonically vibrating the hexane suspension, to grow diamond seeds on the $Si_3N_4$ ceramic substrate; and 2) ultrasonically cleaning the $Si_3N_4$ ceramic substrate in acetone for 3-8 min, and then in 92-98% anhydrous alcohol for 2-4 min; drying the $Si_3N_4$ ceramic substrate and placing in a hot-wire chemical vapor deposition (CVD) vessel.

In a class of this embodiment, prior to 1), a rake face of the silicon nitride ($Si_3N_4$) ceramic substrate is grinded in diamond slurry on a cast iron grinding plate, and then the rake face is roughened in a nano size by CF4 plasma dry etching.

In a class of this embodiment, in 2), the hot-wire chemical vapor deposition (CVD) vessel operates with the following parameters: a filament temperature of 2000-2400° C., a substrate temperature of 750-800° C., a total pressure of 3.0-5.0 kPa, a total flow of 300-350 sccm, a volume ratio of $CH_4/H_2$ of 1-3%, and a deposition time of 6-10 h.

In a class of this embodiment, the particle size of the diamond powders is 0.5-1 µm.

In another aspect, the disclosure also provides a method of machining a graphite mold for hot bending of glass for a curved surface mobile phone, the method comprising machining the graphite mold using the cutting tool.

The following advantages are associated with the cutting tool of the disclosure. The cutting tool comprises a silicon nitride ($Si_3N_4$) ceramic substrate; and a diamond film coated on a surface of the $Si_3N_4$ ceramic substrate, and the diamond film has a thickness of 7-12 µm. Owing to excellent chemical and physical properties, the diamond films of the disclosure obtained through chemical vapor deposition (CVD) have high hardness, excellent wear resistance and chemical stability. Integrating the advantages of the coating materials and the ceramic substrate, the cutting tool of the disclosure exhibits good cutting performance, high hardness and wear resistance, and low friction coefficient.

The thermal expansion coefficient of the silicon nitride ceramic material is close to that of diamond (3.0 and 3.7, respectively), which can reduce the thermal expansion stress of the CVD diamond film and silicon nitride ceramic substrate, thus producing good adhesion therebetween. Because there is no cobalt in the ceramic substrate, there is no need to pretreat the substrate and remove cobalt (Co) through corrosion.

The cutting tool of the disclosure is suitable for high speed machining of a graphite mold for hot bending of glass for curved surface mobile phones. The CVD diamond film coated on the surface of silicon nitride ceramic substrate improves the interface conditions of the tool, and the cutting tool features high hardness and wear resistance, high thermal conductivity and low wear resistance. The cutting tool can be used to process graphite, ceramics and so on, and the problems such as tool loss, electrode collapse and slow processing speed when processing graphite electrode are prevented.

Figure 1:
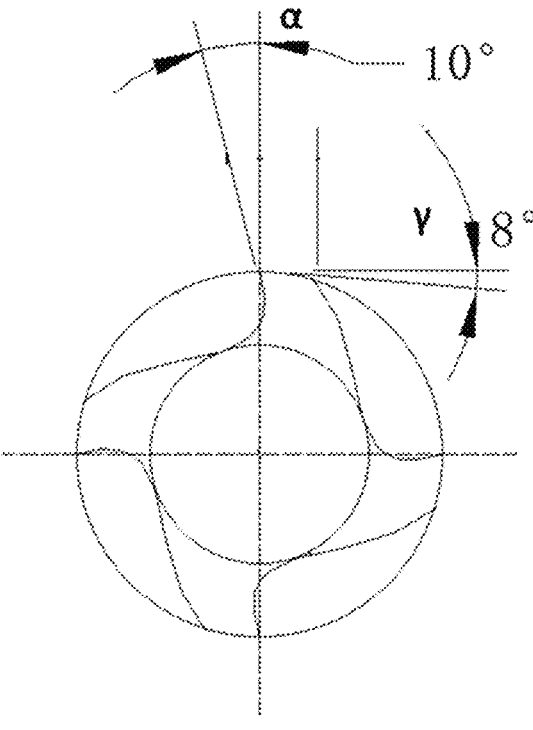
FIG. 1 is a local view of cutting edges of a cutting tool according to one embodiment of the disclosure.

In the drawings, the following reference numbers are used: 1. Tool nose; 2. Blade; 3. Handle.

DETAILED DESCRIPTION

To further illustrate, embodiments detailing a cutting tool and a preparation method thereof are described below. It should be noted that the following embodiments are intended to describe and not to limit the disclosure.

The disclosure provides a cutting tool comprising a silicon nitride ($Si_3N_4$) ceramic substrate and a diamond film coated on the surface of the $Si_3N_4$ ceramic substrate, and the diamond film has a thickness of 7-12 μm. In this example, the thickness is 10 μm.

Figure 2:
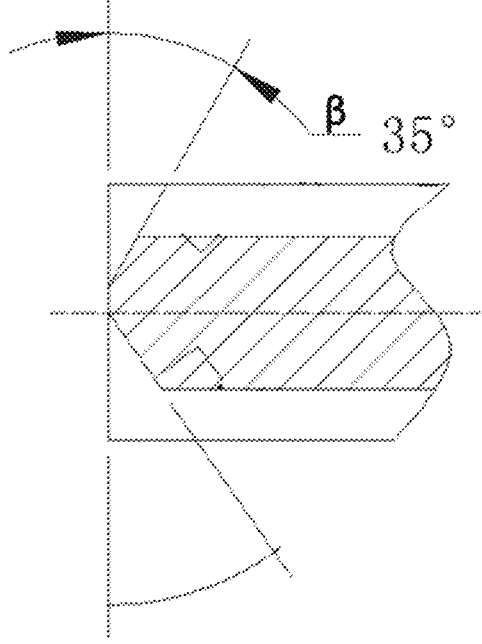
FIG. 2 is a schematic diagram of a helix angle of cutting edges of a cutting tool according to one embodiment of the disclosure.
Figure 3:
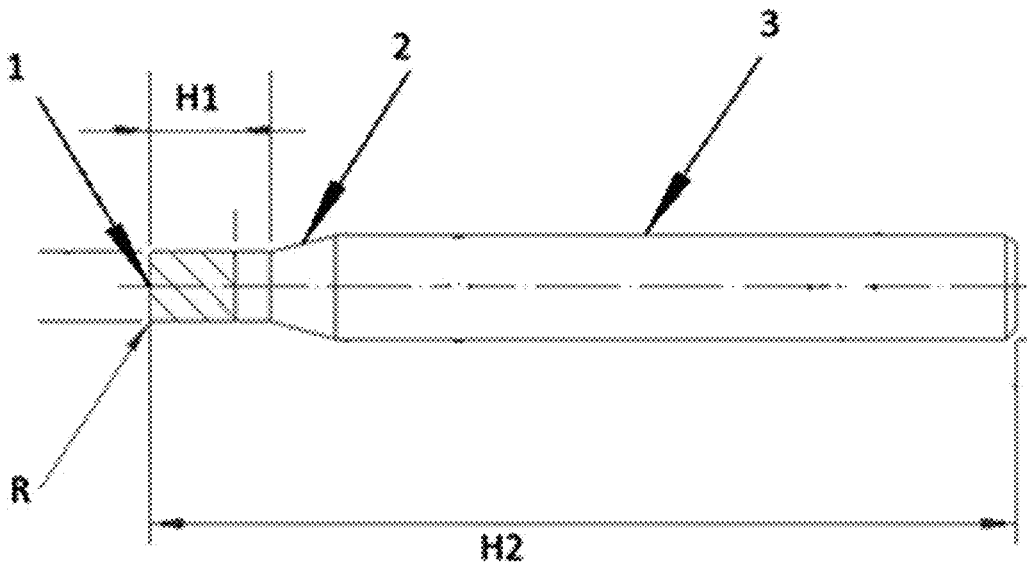
FIG. 3 is a schematic diagram of a cutting tool according to one embodiment of the disclosure.

As shown in FIGS. 1-3, the cutting tool comprises a tool nose 1, a blade 2, and a handle 3; the blade 2 has a rake angle γ of 5-15°, a clearance angle α of 10-14°, and a helix angle of 15-45°; the radius R of the tool nose is 0.18-0.22 mm. The blade has a length H1 of 4.7-5.3 mm. The cutting tool has a length H2 of 49.5-50.5 mm.

Specifically, in this example, the rake angle γ is 8°, the clearance angle α is 10°, and the helix angle of 35°. The radius R of the tool nose is 0.2 mm. The blade has a length H1 of 5 mm. The cutting tool has a length H2 of 50 mm. The blade comprises four cutting edges.

In operation, a proper geometric angle of the cutting tool with respect to the workpiece is helpful to reduce the vibration thereof, so that the graphite workpiece is not easy to collapse, and thus improving the overall cutting performance of the cutting tool.

A method of preparing the cutting tool comprises:

1) putting silicon nitride ($Si_3N_4$) ceramic substrate in a hexane suspension mixed with diamond powders, and ultrasonically vibrating the hexane suspension, to grow diamond seeds on the $Si_3N_4$ ceramic substrate; and 2) ultrasonically cleaning the $Si_3N_4$ ceramic substrate in acetone for 3-8 min, and then in 92-98% anhydrous alcohol for 2-4 min; drying the $Si_3N_4$ ceramic substrate and placing in a hot-wire chemical vapor deposition (CVD) vessel.

In certain embodiments, prior to 1), a rake face of the silicon nitride ($Si_3N_4$) ceramic substrate is grinded in diamond slurry on a cast iron grinding plate, and then the rake face is roughened in a nano size by CF4 plasma dry etching. After laser nano treatment, the surface the substrate of the ceramic tool is rough, which is favorable for diamond to bond with the substrate and grow.

Specifically, in 1), the $Si_3N_4$ ceramic substrate is ultrasonically cleaned in acetone for 5 min, and then in 95% anhydrous alcohol for 3 min.

In 2), the hot-wire chemical vapor deposition (CVD) vessel operates with the following parameters: a filament temperature of 2000-2400° C., a substrate temperature of 750-800° C., a total pressure of 3.0-5.0 kPa, a total flow of 300-350 sccm, a volume ratio of $CH_4/H_2$ of 1-3%, and a deposition time of 6-10 h. In this example, the filament temperature is 2200° C., the substrate temperature is 780° C., the total pressure is 4.0 kPa, the total flow of 320 sccm, the volume ratio of $CH_4/H_2$ is 2%, and the deposition time is 8 h.

The particle size of the diamond powders is 0.5-1 μm. In this example, the particle size is 1 μm.

Figure 4:
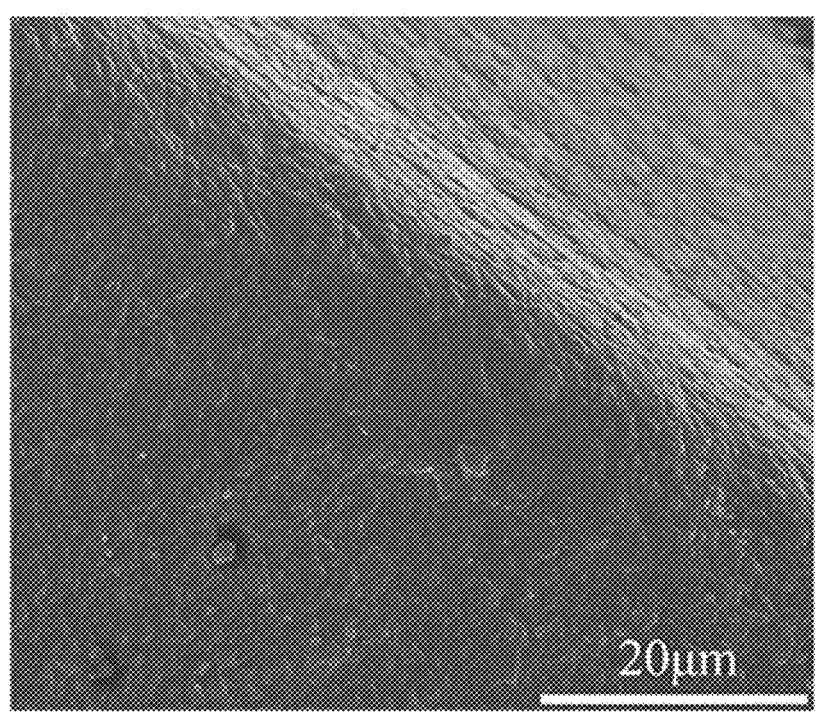
FIG. 4 is a scanning electron microscope (SEM) diagram of a cutting edge of a cutting tool according to one embodiment of the disclosure.

As shown in FIG. 4, the diamond film coating has good uniformity and coverage.

Figure 5:
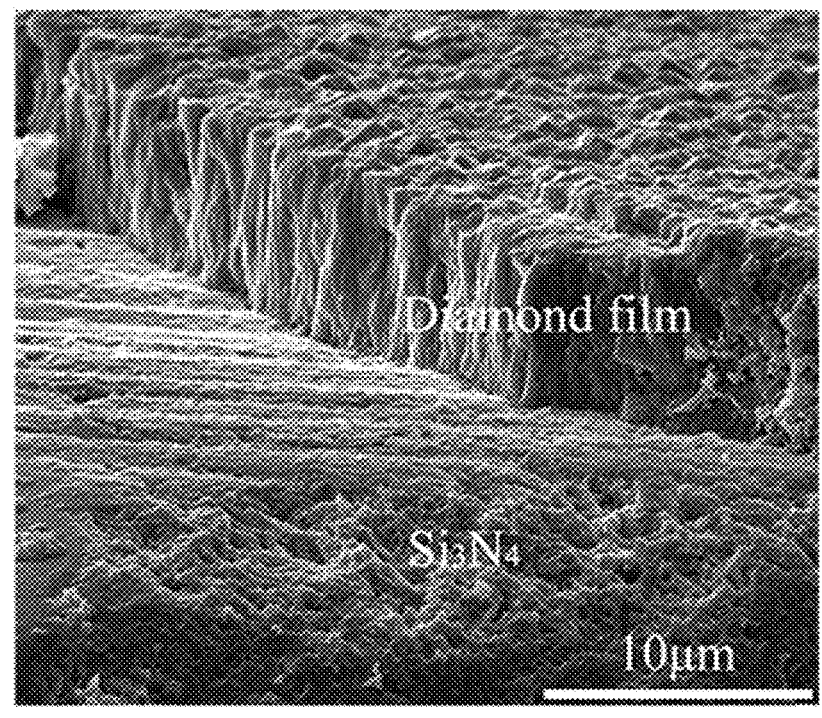
FIG. 5 is a scanning electron microscope (SEM) diagram of a cross section of a cutting tool according to one embodiment of the disclosure.

As shown in FIG. 5, the $Si_3N_4$ ceramic substrate is rough in the surface, which is favorable for nucleation and bonding of the diamond. The film/substrate interface is compact, uniform and adhesive, which proves that Si in the silicon nitride ceramic substrate improves the adhesion between the film coating and the substrate, thus improving the wear resistance and service life of the cutting tool.

Figure 6:
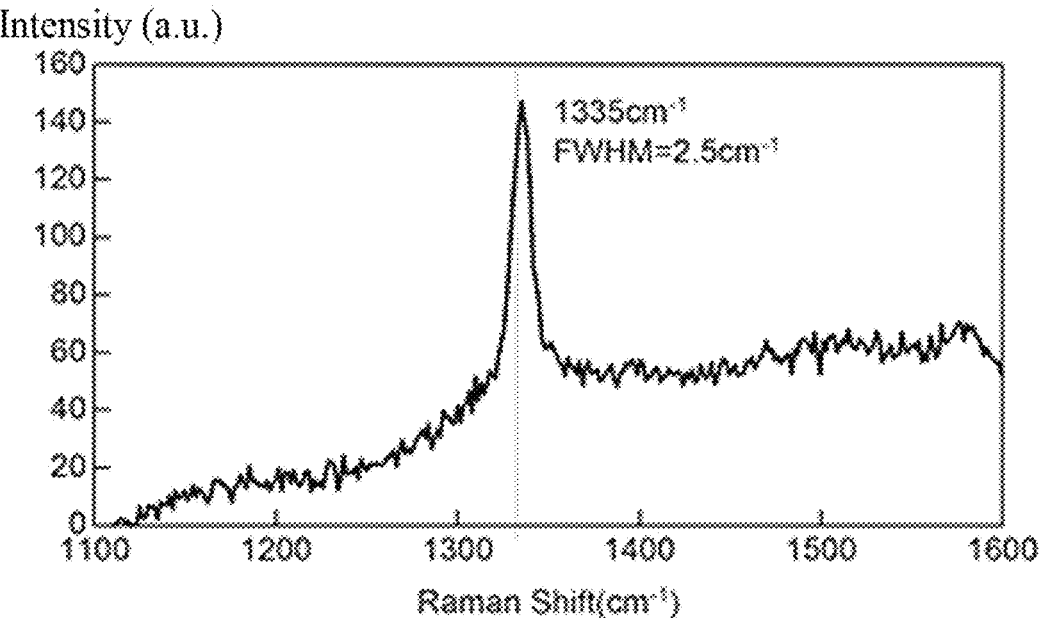
FIG. 6 is a Raman intensity of a diamond film of a cutting tool according to one embodiment of the disclosure.

The quality and residual stress of the diamond film were measured by the LaBram HR Evolution Raman spectrometer. The laser wavelength of the spectrometer was 800 nm, and the light transmission efficiency was >30%. Natural diamond (ND) only has a sharp characteristic peak at 1332.5 $cm^{-1}$. As shown in FIG. 6, the Raman frequency shift corresponding to the maximum Raman spectral intensity of the diamond film on the silicon nitride ceramic substrate is 1335 $cm^{-1}$, and the full width at half maximum (FWHM) of the wave peak is 2.5 $cm^{-1}$. From the above results, the following conclusions can be drawn: the maximum shift peak value of the spectrum is 2.5 $cm^{-1}$, and the peak position moves up slightly, which indicates that the diamond film has less compressive stress, while the smaller FWHM value indicates that the diamond film has higher quality compared with conventional cutting tools, and the surface is SP3 hybrid cubic crystal corundum.

Figure 7:
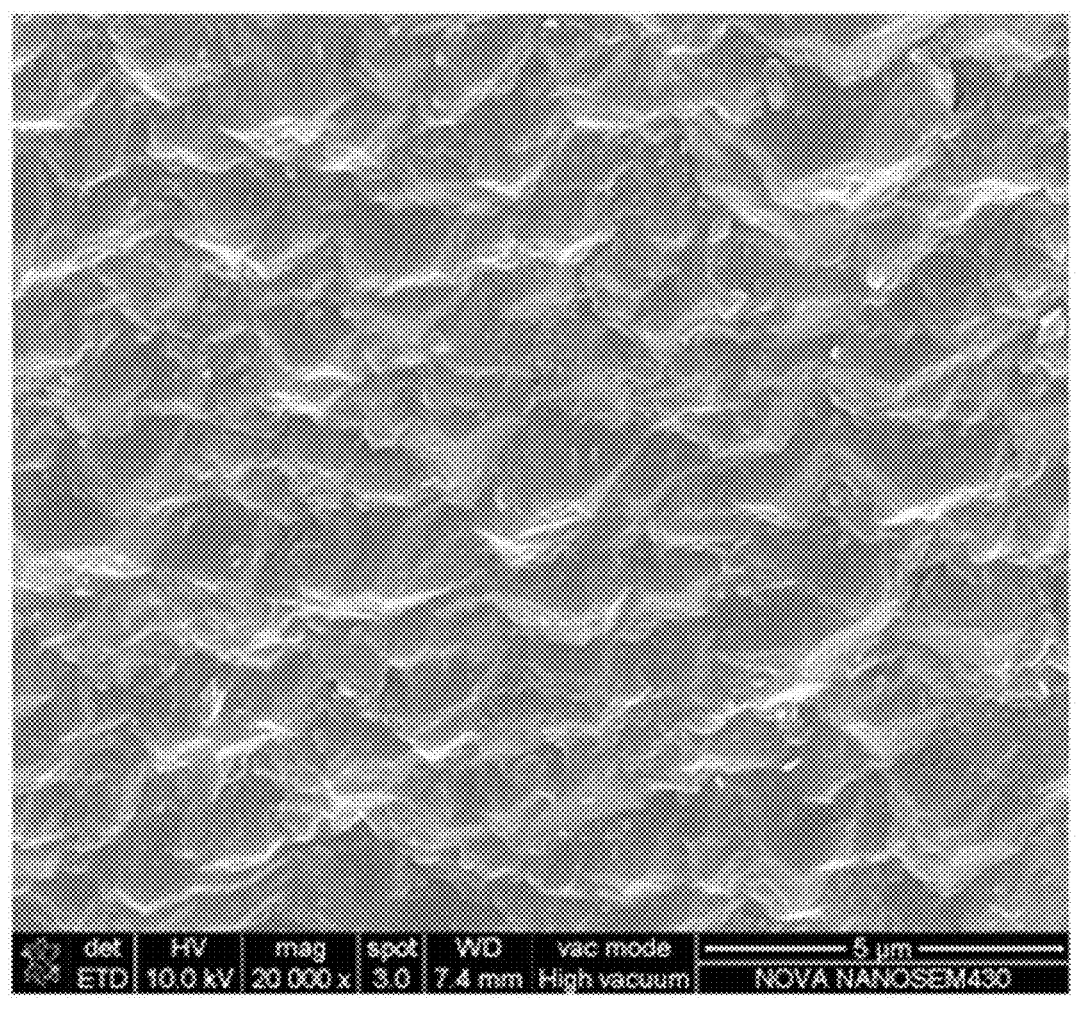
FIG. 7 is a scanning electron microscope (SEM) diagram of a diamond film of a cutting tool according to one embodiment of the disclosure.

To evaluate the surface sharpness of the cutting tool comprising a diamond film coating, the surface morphology of the cutting tool is measured by means of Fastcan AFM atomic force microscope produced by Bruker, as shown in FIG. 7. Regarding the morphology, the surface of the diamond film is smooth, and the crystal of the diamond particles is clear. The surface roughness is Ra 8.1 nm and RMS 8.6 nm. Owing to the introduction of Si element in the ceramic substrate, the grain size is significantly refined, the internal stress of the coating is reduced, and the adhesion between the coating and the substrate is improved, thus solving the problem of insufficient adhesion between diamond coating and the substrate.

Figure 8:
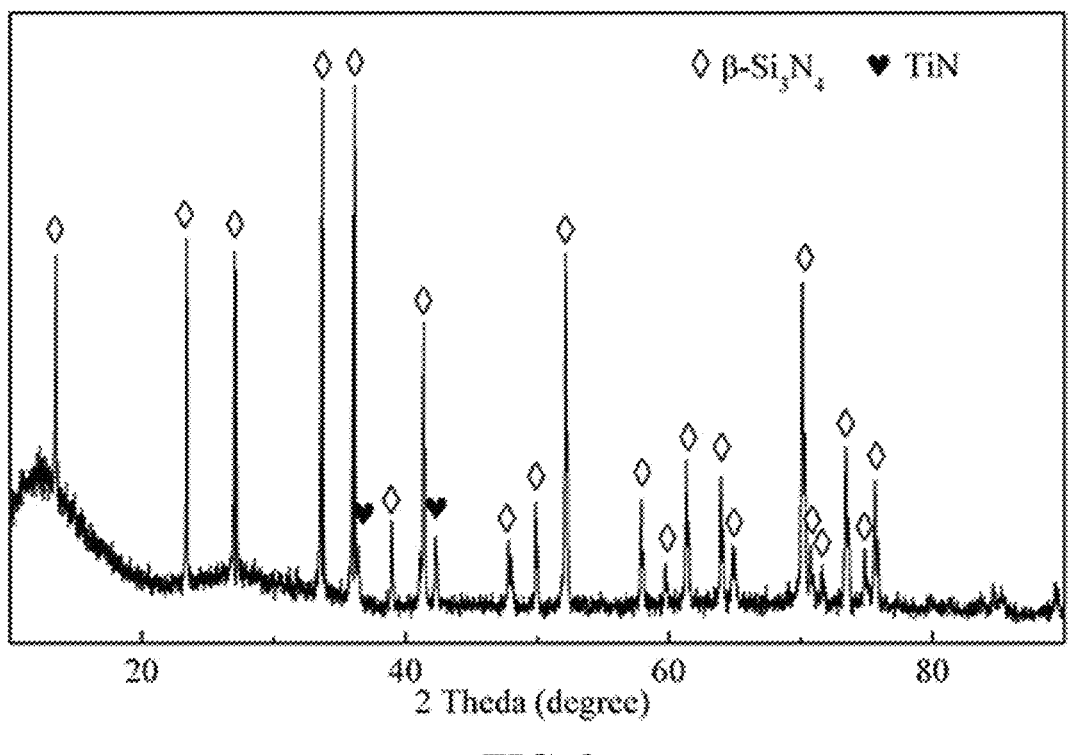
FIG. 8 is an X-ray diffraction spectrum of a cutting tool according to one embodiment of the disclosure.

As shown in FIG. 8, there are mainly cubic silicon nitride (β-$Si_3N_4$) and low volume fraction of TiN in the diamond ($Si_3N_4$) tools, which indicates that diamond ($Si_3N_4$) tools are TiN particle reinforced β-$Si_3N_4$ ceramic tools.

Figure 9:
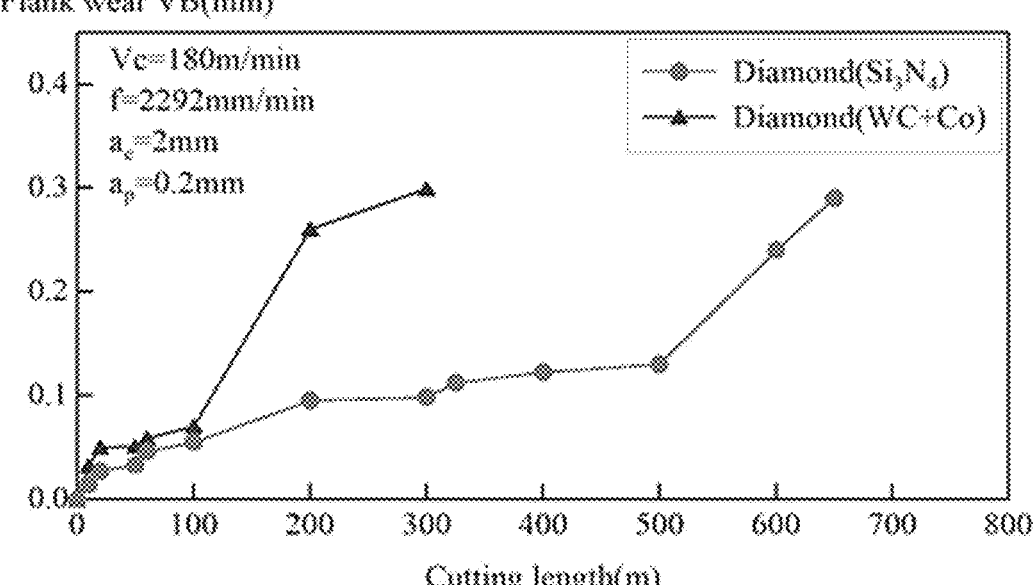
FIG. 9 is a schematic diagram showing a service life of a cutting tool according to one embodiment of the disclosure.

As shown in FIG. 9, the service life of the diamond tool ($Si_3N_4$) is much longer than that of CVD diamond coated carbide tool. Tool life: Diamond ($Si_3N_4$)>diamond (WC—Co).

The thermal expansion coefficient of the silicon nitride ceramic material is close to that of diamond (3.0 and 3.7, respectively), which can reduce the thermal expansion stress of the CVD diamond film and silicon nitride ceramic substrate, thus producing good adhesion therebetween. Because there is no cobalt in the ceramic substrate, there is no need to pretreat the substrate and remove cobalt (Co) through corrosion. At the same time, the CVD diamond film deposited on the silicon nitride ceramic material can not only fill the surface defects of the silicon nitride ceramic material, but also improve the surface hardness, reduce the friction coefficient, improve the wear resistance and corrosion resistance, so as to improve the wear resistance and service life of the tool.

Figure 10A:
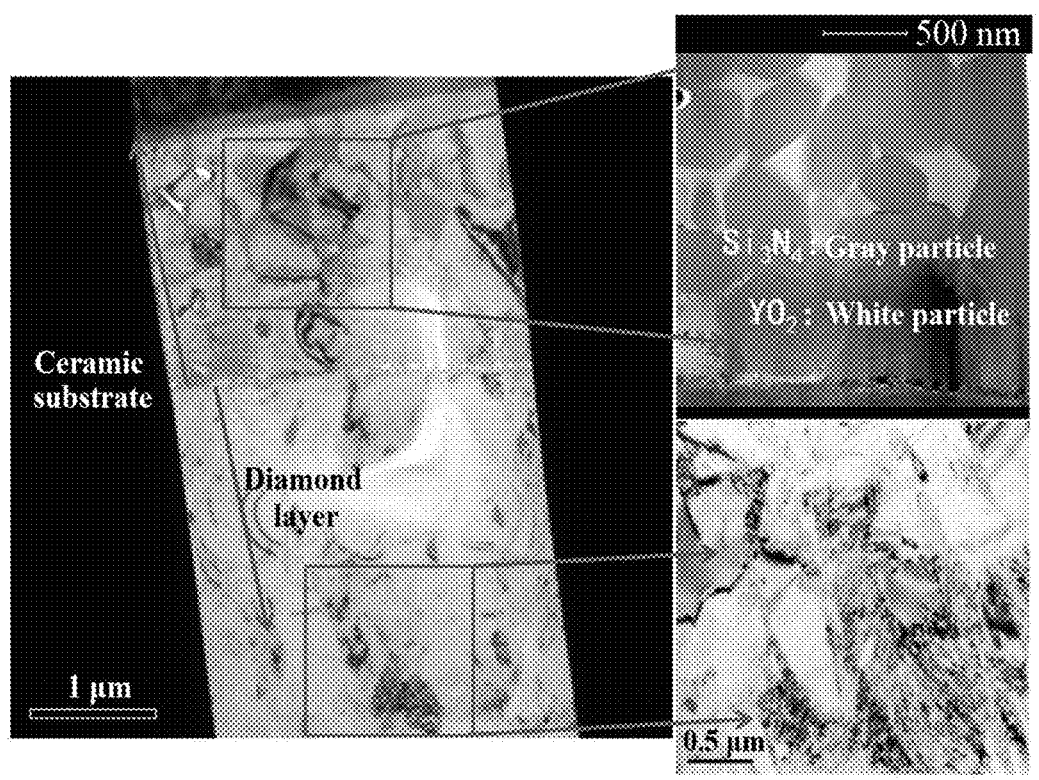
FIG. 10A is a schematic diagram of a composite interlayer of nanocrystalline embedded amorphous matrix formed between a $Si_3N_4$ ceramic substrate and a diamond film according to one embodiment of the disclosure.
Figure 10B:
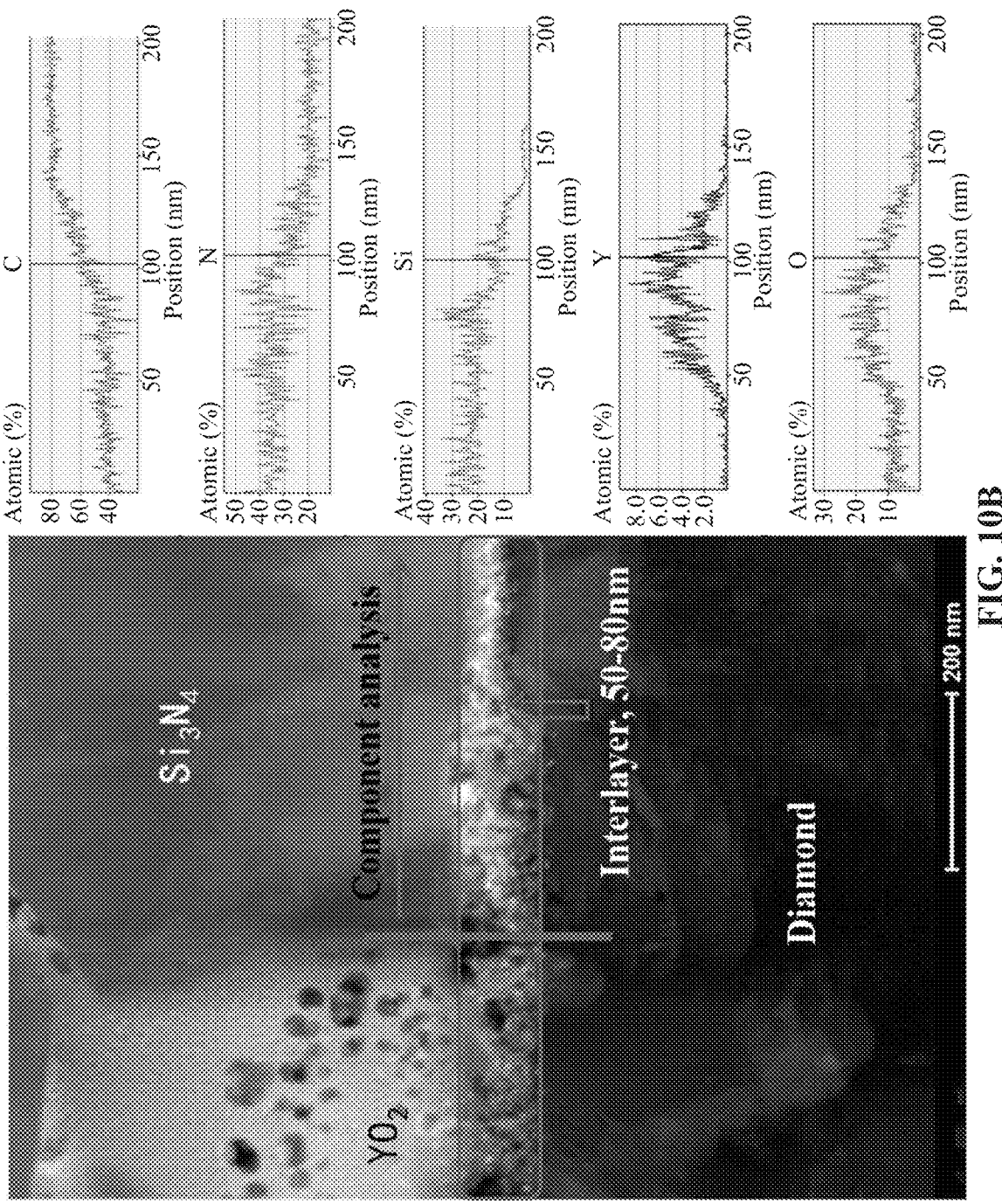
FIG. 10B is a schematic diagram of an interlayer formed by matrix and diamond and embedded in amorphous matrix.

As shown in FIGS. 10A-10B, through focused ion beam (FIB) detection, an interlayer is formed between matrix and the diamond film and embedded in the amorphous matrix. Specifically, a composite intermediate layer comprising nanocrystalline and amorphous matrix is formed on the interface between the ceramic and diamond. At the same time, the diffusion of carbon and nitrogen occurs in the process of diamond deposition, resulting in the transformation of $Si_3N_4$ phase into $Si_3(C, N)_4$ composite phase, and the diamond is doped with a small amount of nitrogen. The interlayer diffuses with C and N thus improving the adhesion of diamond. In addition, the diamond grains are fine, and there are high density twin crystals and stacking faults, which make the diamond coating have good toughness and high hardness.

The cutting tool of the disclosure comprising the silicon nitride ($Si_3N_4$) ceramic substrate and the diamond film can be used for high-speed machining of a graphite mold for hot bending of glass for curved surface mobile phones.

Graphite is a typical brittle material with layered structure, which is easy to break and wear the cutting tool during machining. Tool wear is a concern in graphite electrode machining, which not only affects the production cost and processing time, but also affects the surface quality of the workpieces. The main factors affecting the tool wear comprise cutting speed, tool path, geometric angle, cutting depth, cutting parameters and graphite material. Graphite material has high hardness, so the cutting tool needs high wear resistance and impact resistance.

The diamond coated silicon nitride ceramic tool of the disclosure has high wear resistance, high hardness, high lubricity of the coating surface, long service life and high-cost performance, which is suitable for graphite finishing. At present, diamond coating is the best choice for cutting tools for machining graphite, which can improve the performance of the cutting tools and ensure the dimensional accuracy and smoothness of graphite surface.

Owing to excellent chemical and physical properties, the diamond films of the disclosure obtained through chemical vapor deposition (CVD) have high hardness, excellent wear resistance and chemical stability. Integrating the advantages of the coating materials and the ceramic substrate, the cutting tool of the disclosure exhibits good cutting performance, high hardness and wear resistance, and low friction coefficient, thus prolonging the service life of the cutting tool.

It will be obvious to those skilled in the art that changes and modifications may be made, and therefore, the aim in the appended claims is to cover all such changes and modifications.

What is claimed is:

1. A method of preparing a cutting tool, the method comprising:
   1. Putting a silicon nitride ($Si_3N_4$) ceramic substrate in a hexane suspension mixed with diamond powders, and ultrasonically vibrating the hexane suspension, to grow diamond seeds on the $Si_3N_4$ ceramic substrate, wherein the $Si_3N_4$ ceramic substrate further comprises TiN particles; and
   2. Ultrasonically cleaning the $Si_3N_4$ ceramic substrate in acetone for 3-8 min, and then in 92-98% anhydrous alcohol for 2-4 min; drying the $Si_3N_4$ ceramic substrate and placing the $Si_3N_4$ ceramic substrate in a hot-wire chemical vapor deposition (CVD) vessel to produce the cutting tool;
   wherein
   the cutting tool comprises a diamond film coated on a surface of the $Si_3N_4$ ceramic substrate, and the diamond film having a thickness of 7-12 μm, an arithmetic average roughness (Ra) value of 8.1 nm, and a root mean square roughness (RMS) value of 8.6 nm.

2. The method of claim 1, wherein prior to 1), a rake face of the silicon nitride ($Si_3N_4$) ceramic substrate is grinded in a diamond slurry on a cast iron grinding plate, and then the rake face is roughened in a nano size by CF4 plasma dry etching.

3. The method of claim 1, wherein in 2), the hot-wire chemical vapor deposition (CVD) vessel operates with the following parameters: a filament temperature of 2000-2400° C., a substrate temperature of 750-800° C., a total pressure of 3.0-5.0 kPa, a total flow of 300-350 sccm, a volume ratio of $CH_4/H_2$ of 1-3%, and a deposition time of 6-10 h.

4. The method of claim 1, wherein a particle size of the diamond powders is 0.5-1 μm.

* * * * *